(12) United States Patent
Shaw et al.

(10) Patent No.: US 8,657,942 B2
(45) Date of Patent: Feb. 25, 2014

(54) TRAP DEVICE

(75) Inventors: Christopher John Shaw, Hurstpierpoint (GB); Graeme Huntley, Newport (GB); Andrew James Seeley, Bristol (GB)

(73) Assignee: Edwards Limited (GB)

( * ) Notice: Subject to any disclaimer, the term of this patent is extended or adjusted under 35 U.S.C. 154(b) by 1090 days.

(21) Appl. No.: 11/887,124

(22) PCT Filed: Mar. 9, 2006
(Under 37 CFR 1.47)

(86) PCT No.: PCT/GB2006/000840
§ 371 (c)(1),
(2), (4) Date: Apr. 23, 2009

(87) PCT Pub. No.: WO2006/100431
PCT Pub. Date: Sep. 28, 2006

(65) Prior Publication Data
US 2010/0024654 A1    Feb. 4, 2010

(30) Foreign Application Priority Data

Mar. 22, 2005  (GB) .................................. 0505674.2
Jun. 6, 2005   (GB) .................................. 0511484.8

(51) Int. Cl.
*B01D 45/00* (2006.01)

(52) U.S. Cl.
USPC ............... 96/408; 55/385.1; 55/421; 55/423; 55/425; 55/426; 55/428; 55/428.1; 55/466; 96/412; 96/417; 438/905; 438/909

(58) Field of Classification Search
USPC ........... 55/385.2, 385.1, 434.2, 446, DIG. 15, 55/482, 418; 96/228, 231, 232, 417, 420, 96/423, 416; 118/715; 156/345.29; 62/55.5; 159/31, 42; 438/905, 909
See application file for complete search history.

(56) References Cited

U.S. PATENT DOCUMENTS

| 3,274,373 A | 9/1966 | Maddox |
| 5,407,704 A | 4/1995 | Basta et al. |
| 5,820,641 A * | 10/1998 | Gu et al. .................... 55/434.4 |

(Continued)

FOREIGN PATENT DOCUMENTS

| EP | 1 188 918 A2 | 3/2002 |
| JP | 10266961 A | 10/1998 |
| JP | 2004111788 A | 4/2004 |
| WO | WO 2004/036048 A1 | 4/2004 |
| WO | WO 2004/071625 A1 | 8/2004 |

OTHER PUBLICATIONS

United Kingdom Search Report of Application No. GB 0505674.2; Claims searched: 1-18; Date of search: Jun. 29, 2005.

(Continued)

*Primary Examiner* — Duane Smith
*Assistant Examiner* — Minh-Chau Pham
(74) *Attorney, Agent, or Firm* — Shumaker & Sieffert, P.A.

(57) ABSTRACT

A trap device includes means for separating a liquid compound from a waste stream exhaust from a process chamber, means for collecting the liquid compound separated from the waste stream, means for selectively isolating the collected liquid compound from the waste stream, and means for evaporating the collected liquid compound to return the compound in gaseous form to the waste stream. This can enable a volatile liquid to be collected at a defined location, isolated from the waste stream, and, when so desired, returned to the waste stream in the form of a gas for subsequent abatement.

24 Claims, 2 Drawing Sheets

(56) References Cited

U.S. PATENT DOCUMENTS

| | | | | |
|---|---|---|---|---|
| 5,904,757 | A * | 5/1999 | Hayashi et al. | 96/416 |
| 6,093,228 | A * | 7/2000 | Wang | 55/385.1 |
| 6,578,367 | B1 | 6/2003 | Schaefer et al. | |
| 6,966,936 | B2 * | 11/2005 | Yamasaki et al. | 55/385.2 |
| 6,969,414 | B2 * | 11/2005 | Fisher | 55/350.1 |
| 7,892,320 | B2 * | 2/2011 | Cho et al. | 95/19 |
| 2001/0015133 | A1 * | 8/2001 | Sakai et al. | 95/273 |
| 2005/0144915 | A1 * | 7/2005 | Chen et al. | 55/482 |
| 2007/0125050 | A1 * | 6/2007 | Nakajima et al. | 55/418 |
| 2008/0210089 | A1 * | 9/2008 | Tsangaris et al. | 95/90 |
| 2009/0200008 | A1 * | 8/2009 | Chandler | 165/289 |

OTHER PUBLICATIONS

PCT Notification of Transmittal of the International Search Report and the Written Opinion of the International Searching Authority, or the Declaration of International Application No. PCT/GB2006/000840; Date of mailing: Jul. 4, 2006.

PCT International Search Report of International Application No. PCT/GB2006/000840; Date of mailing of the International Search Report: Jul. 4, 2006.

PCT Written Opinion of the International Searching Authority of International Application No. PCT/GB2006/000840; Date of mailing: Jul. 4, 2006.

* cited by examiner

TRAP DEVICE

FIELD OF THE INVENTION

The present invention relates to a trap device, and in one example relates to a trap device for collecting volatile liquid contained within a waste stream exhaust from a process chamber.

BACKGROUND OF THE INVENTION

Some semiconductor processes use tetraethylorthosilicate (TEOS) or other volatile compounds that are liquid at room temperature and pressure. TEOS is commonly supplied to a semiconductor process chamber for the deposition of thin films of silicon dioxide ($SiO_2$) on semiconductor substrates using a chemical vapour deposition (CVD) process. Within the process chamber, the TEOS dissociates in the presence of an oxygen source to form $SiO_2$, which deposits on the substrate within the chamber. Depending on the flow rate of the gaseous TEOS to the chamber, a waste stream drawn from the chamber by a vacuum pumping arrangement typically contains unconsumed TEOS, as well as by-products from the process within the chamber.

The discharge of gaseous TEOS from the process chamber can lead to uncontrolled TEOS condensation downstream from the chamber exhaust, for example due to insufficient purging with relatively inert gas such as $N_2$, or due to a relatively low temperature within the exhaust line from the process chamber. The random accumulation of pools of volatile liquid TEOS within the pumping arrangement can present a safety hazard, as they may react strongly with other species subsequently introduced to the process chamber, for example fluorine for chamber cleaning, and with air leaking into the pumping arrangement. Such accumulation of liquid TEOS within the pumping arrangement can also occur in the event that the process tool discharges liquid TEOS directly to the process chamber or foreline.

An abatement device is typically provided downstream from the process chamber for removing TEOS from the waste stream before it is exhausted into the atmosphere. Random accumulation of liquid within the pumping arrangement conveying the gas stream from the process chamber to the abatement device can lead to large fluctuations in the gas flow entering the abatement device, which can be detrimental to the efficiency of the waste stream abatement.

It is an aim of at least the preferred embodiments of the present invention to seek to solve these and other problems.

SUMMARY OF THE INVENTION

The present invention provides a trap device comprising means for separating a liquid compound from a waste stream exhaust from a process chamber, means for collecting the liquid compound separated from the waste stream, means for selectively isolating the collected liquid compound from the waste stream, and means for evaporating the collected liquid compound to return the compound in gaseous form to the waste stream.

BRIEF DESCRIPTION OF THE DRAWINGS

Preferred features of the present invention will now be described with reference to the accompanying drawings, in which.

DETAILED DESCRIPTION OF THE INVENTION

Figure 1:
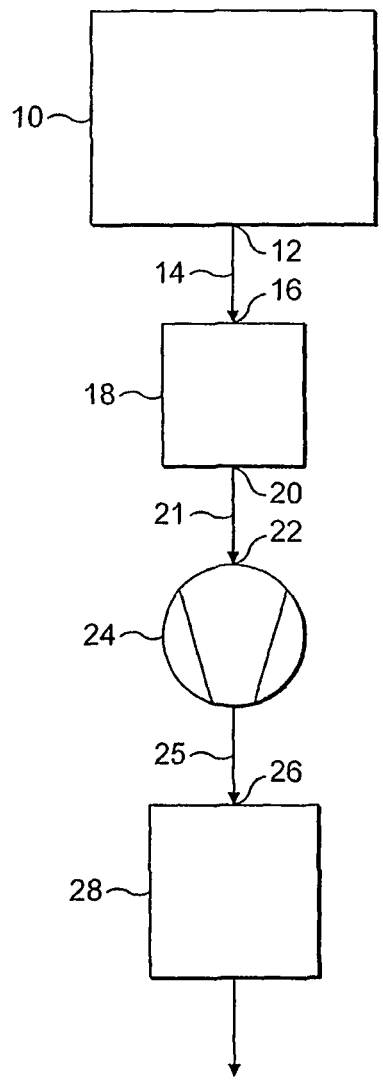
FIG. 1 illustrates schematically a first example of a system for conveying a gas stream from an enclosure to an abatement device.
Figure 2:
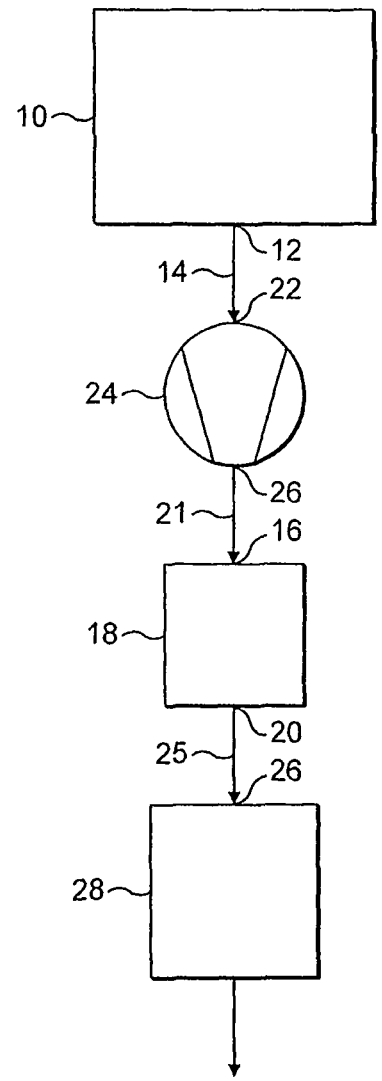
FIG. 2 illustrates schematically a second example of a system for conveying a gas stream from an enclosure to an abatement device.

With reference first to FIG. 1, a processing system, for example for semiconductors or flat panel display devices, comprises a process chamber 10 having at least one inlet for receiving one or more process gases, and an outlet 12 for exhausting a waste stream comprising unconsumed process gases and by-products from the process conducted within the process chamber 10. The outlet 12 from the process chamber 10 is connected by conduit 14 to the inlet 16 of a trap device 18 for removing liquid species from the waste stream exhaust from the process chamber 10. The trap 18 has an outlet 20 connected by a conduit 21 to the inlet 22 of a vacuum pump 24 for drawing the waste stream from the process chamber 10. The vacuum pump 24 has an exhaust 26 connected by a conduit 25 to the inlet of an abatement device 28 for removing one or more harmful components from the waste stream before it is exhaust into the atmosphere. The processing system illustrated in FIG. 2 is similar to that in FIG. 1, but with the exception that the trap device 18 is now located downstream from the vacuum pump 24.

Figure 3:
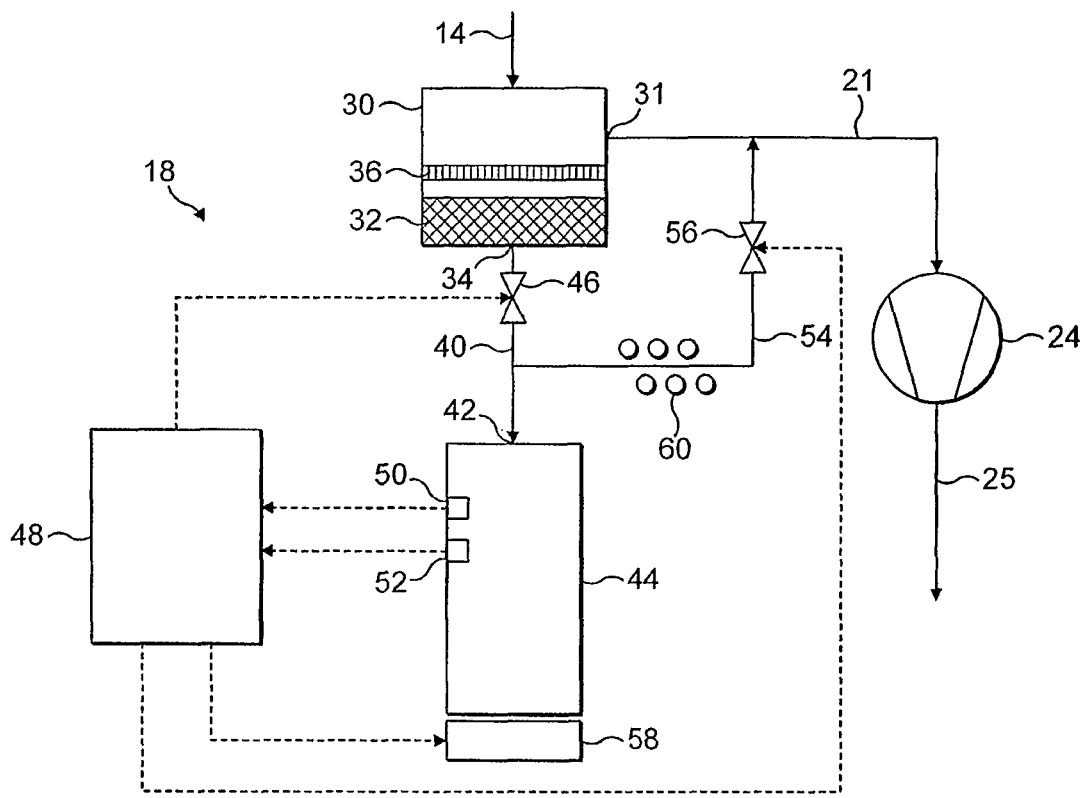
FIG. 3 illustrates a first embodiment of a trap device suitable for use in the system of FIG. 1 or FIG. 2.

A first embodiment of a trap device 18 suitable for use with either of the systems described above is illustrated in FIG. 3 in relation to the system illustrated in FIG. 1. The trap 18 comprises a separation unit 30 for receiving the waste stream from the conduit 14 and separating a liquid compound from the waste stream, so that a waste stream substantially devoid of the liquid compound leaves the separation unit through first outlet 31 to the conduit 21. Liquids that may be present within a waste stream from a process chamber include volatile liquids, such as TEOS and other organometallics. The separation unit 30 includes a first filter 32, which may be in the form, for example, of a mesh, sintered metal or PTFE sponge, for allowing the liquid compound to pass therethrough to a second outlet 34 from the separation unit 30 but inhibiting the passage of solid matter contained within the waste stream. As illustrated in FIG. 3, optionally a second, particulate pre-filter 36 may be provided for trapping particulates contained within the waste stream. This second filter 36 may be integral with the first filter 32 or, as illustrated, may be separate therefrom. This second filter 36 should optimally be designed such that it does not provide pockets in which volatile liquid compound may accumulate.

The trap device includes a first, downwardly extending, trap conduit system 40 that receives the liquid compound separated from the waste stream at an inlet located at the upper end thereof. The first trap conduit 40 has an outlet 42 located at the other end thereof through which the liquid compound enters a container 44 connected to the outlet 42 for collecting the separated liquid compound. A first valve 46 or other variable flow control device is provided within the first trap conduit 40 for selectively isolating the container 44 from the separation unit 30. Opening and closing of the valve 46 is controlled by signals received from a controller 48. As illustrated in FIG. 3, the controller 48 also receives signals from a level detector 50 for detecting the amount of liquid compound collected by the container 44, and from a thermocouple 52 for detecting the temperature within the container 44. The trap device 18 further includes a second trap conduit system 54 connected between the first trap conduit 40 and the conduit 21. A second valve 56 is located within the second trap conduit 54. Similar to the first valve 46, opening and closing of the second valve 56 is controlled by signals received from controller 48.

In use, with first valve 46 open and, second valve 56 closed, liquid compound separated from a waste stream entering separation unit 30 passes through the second outlet 34 from the separation unit 30 and is conveyed by the first conduit system 40 to the container 44.

In order to dispose of the liquid collected within the container 44, the container 44 may be detachably connected to the second trap conduit 40 to enable the collected liquid to be tipped from the container 44. Alternatively, the container 44 may be provided with a drain through which the liquid is periodically drained from the container. Whilst each of these alternatives enables the container 44 to be rapidly emptied of liquid, where the collected liquid is volatile it is important that the liquid is not exposed to air.

In view of this, periodically, or in response to signals received from the detector 50 and/or thermocouple 52, the controller 48 closes the first valve 46, opens the second valve 56, and activates a heater 58 to heat the liquid compound to a temperature T1 at which at least some of the liquid compound within the container 44 is evaporated to form gaseous compound. The gaseous compound rises from the container 44 and enters the second trap conduit 54, which conveys the gaseous compound to the conduit 21 and thus back to the waste stream. In order to prevent condensation of the gaseous compound within the second trap conduit 54, a heater 60 may be provided for heating the second trap conduit 54 to a temperature T2 greater than T1. In order to control the rate at which the gaseous compound enters the conduit 21 from the second trap conduit 54, the second valve 56 may be provided by a butterfly valve or other variable flow control device having a conductance that is dependent on, preferably proportional to, the magnitude of signal output from the controller 48 to the second valve 56.

By separating the liquid compound from the waste stream and collecting the separated liquid compound at a well-defined location, the trap device 18 can thus prevent the random accumulation of pools of liquid compound within the conduits 14, 21 and pump 24. The return of the liquid compound to the waste stream in gaseous form can reduce the likelihood of such pools of liquid compound forming downstream from the trap device 18, and can enable the gaseous compound to be safely treated within the abatement device 28. The container 44 can also be isolated from the waste stream, by closing the valves 46, 56, in the event that a reactive fluid which would otherwise react with the liquid compound collected in the container passes through the conduits 14, 21, for example, during chamber cleaning.

Figure 4:
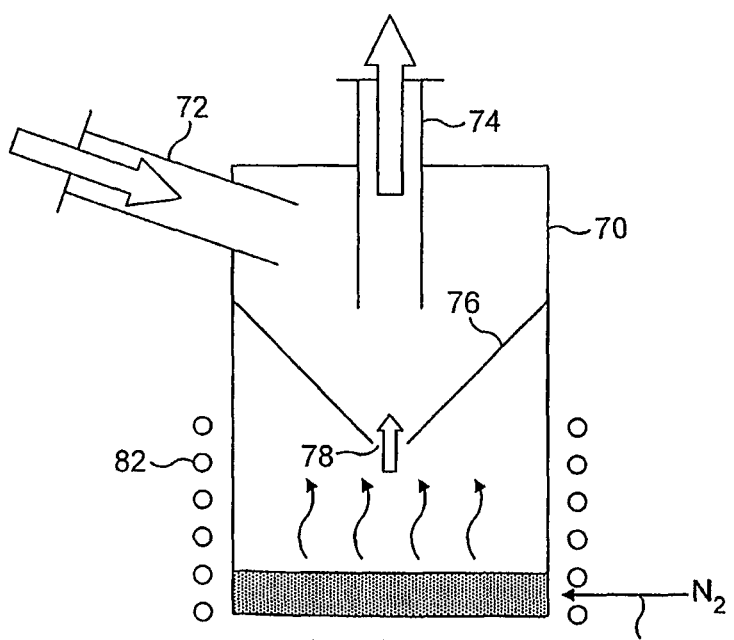
FIG. 4 illustrates a second embodiment of a trap device suitable for use in the system of FIG. 1 or FIG. 2.

FIG. 4 illustrates a second embodiment of a trap device 18 suitable for use with either of the systems described in FIGS. 1 and 2. In this embodiment, the trap device 18 is in the form of a "cyclone"-type trap device, and comprises a container 70 having an inlet in the form of an inlet conduit 72 connectable to the conduit 14 for receiving the waste stream from the process chamber 10, and an outlet in the form of an outlet conduit 74 connectable to the conduit 21 for conveying the waste stream to the vacuum pump 24. The container 70 includes a frustro-conical baffle 76 located beneath the inlet and outlet conduits 72, 74 and arranged such that the baffle 76 widens towards the inlet and outlet conduits 72, 74. The inlet conduit 72 is arranged such that the waste stream enters the container 70 tangentially, so that as the waste stream swirls within the container 70 above the baffle 76, the liquid compound within the waste stream is separated therefrom. The liquid compound falls through the aperture 78 within the baffle 76 and collects at the bottom of the container 70. As illustrated in FIG. 4, the container 70 is preferably arranged such that any liquid compound within the conduit 14 drains into the container 70 under gravity.

In order to isolate the collected liquid from a subsequent waste stream when the waste stream contains a reactive fluid which would otherwise react with the liquid compound collected in the container 70, the trap device 18 includes a purge gas supply 80 for supplying a purge gas, such as $N_2$, to the container 70 to form a "blanket" of purge gas beneath the baffle 76. This blanket of purge gas serves to inhibit contact between the reactive fluid and the collected liquid. As illustrated in FIG. 4, the purge gas supply 80 may be located such that the purge gas flows through or proximate the collected liquid to promote evaporation of the collected liquid to enable the gaseous compound to be returned to the waste stream.

The temperature within the container 70 is preferably normally maintained at a temperature below that of the conduit 14, preferably around 10 to 30° C. cooler than the conduit 14 so that there is preferential condensation of the liquid compound therein. Similar to the first embodiment, a heater 82 is provided for selectively heating the liquid compound to a temperature at which at least some of the liquid compound is evaporated to form gaseous compound. The evaporation rate of liquid compound from the container 70 is then controlled by both the flow rate of purge gas to the container, and the heater 82. The gaseous compound rises through the aperture 78 in the baffle 76 and enters the waste stream.

As in the first embodiment, a level detector may be provided for detecting the amount of liquid compound collected within the container 70, and/or a thermocouple may be provided for detecting the temperature within the container 70. In the event that the amount of liquid compound collected within the container 70 exceeds a predetermined amount, the supply of the liquid compound to the container 70 can be interrupted until the level of collected liquid compound reduces below the predetermined level, or a second, lower predetermined level. Similarly, in the event that the temperature within the container 70 exceeds a predetermined temperature, the supply of the liquid compound to the container 70 can be interrupted until the temperature within the container reduces below the predetermined temperature, or a second, lower predetermined temperature.

The present invention can thus enable a volatile liquid compound, for example a volatile organic compound such as TEOS, exhaust from a process chamber to be collected at a defined location, and controllably returned to the waste stream in the form of a gas for subsequent abatement. The amount of volatile liquid compound accumulating within the collecting means, for example, a container, can be controlled by controlled evaporation thereof from the container. For example, the collected liquid may be periodically evaporated from the trap, or may be evaporated from the trap at a substantially constant evaporation rate.

Means are provided for selectively isolating the collected liquid compound from the waste stream. This can prevent the collected liquid compound from being exposed to other fluids exhausted from the process chamber that may react therewith. For example, where the liquid compound is a volatile liquid, any oxidants such as oxygen or a halogen exhausted from the process chamber may react violently with the accumulated liquid, potentially resulting in a deflagration within the container.

In one embodiment, the isolating means comprises means for conveying a purge gas, such as nitrogen or a noble gas, to the collecting means to isolate the collected liquid compound from the waste stream. The purge gas can thus provide a "blanket" for isolating the collected liquid compound from the waste stream. In order to assist in the evaporation of the liquid compound from the collecting means, the purge gas conveying means may be configured to convey purge gas into or proximate the collected liquid compound to promote evaporation thereof, so that the purge gas may convey gaseous component back into the waste stream at a substantially constant evaporation rate. The evaporation means may further, or alternatively, comprise means for heating the collected liquid compound to a temperature at which at least some of the collected liquid compound is evaporated to form gaseous compound. Where purge gas is supplied to the collecting means to promote evaporation of liquid compound therefrom, the heating means can assist in achieving a substantially constant evaporation rate therefrom. Alternatively, the heating means can provide for periodic evaporation of liquid compound from the collecting means.

In another embodiment, the means is located within a conduit system for connecting the container to the waste stream. The conduit system may comprise first conduit means for conveying the liquid compound from the separating means to the container, and second conduit means for conveying the gaseous compound from the container to the waste stream downstream from the separating means. In this case, the isolating means may comprise a first valve located in the first conduit means for selectively isolating the container from the separating means, and a second valve located in the second conduit means for selectively isolating the container from the waste stream downstream from the separating means. Preferably, the first valve and the second valve are open during processing for the collection of liquid within the container. When oxidants are admitted to the processing apparatus the first valve and the second valve are closed to avoid a reaction between the oxidant and the compound. The second conduit means is preferably heated during evaporation of the liquid compound from the container to inhibit condensation of the gaseous compound therein.

The collecting means may be arranged in the form of a "deadleg" collection device. The first conduit means mat therefore be arranged to receive the liquid compound from the separating means at one end thereof and supply the liquid compound to the collecting means at the other end thereof, with the second conduit means being located between the ends of the first conduit means and extending outwardly therefrom.

Means are preferably provided for controlling the rate of evaporation of liquid compound from the collecting means. The rate of evaporation of the liquid compound from the collecting means can be controlled, for example by controlling one or both of the temperature of the heater and the flow rate of purge gas to the collecting means. A level sensor or other suitable means may be provided for monitoring the amount of liquid compound collected within the collecting means. Periodic evaporation of collected liquid compound can then be performed depending on the monitored amount. Alternatively, or additionally, the supply of the component to the process chamber can be interrupted for a period of time while the amount of liquid compound within the collecting means is reduced. A thermocouple or other suitable means may be provided for monitoring a temperature within the collecting means, and thereby detect any overheating in the collecting means due to chemical reactions occurring therein. In this event, periodic evaporation of collected liquid compound can be performed.

In one embodiment, the separating means comprises a filter configured to permit the liquid compound to pass therethrough to the collecting means and inhibit the passage of solids therethrough. The separating means may comprise a second filter, integral with or separate from the first-mentioned filter, for capturing particulates contained within the waste stream.

In another embodiment, the separating means is located within the collecting means, for example in the form of an annular baffle located within the collecting means, and which is preferably arranged within the collecting means such that the baffle widens towards an inlet thereof for receiving the waste stream. The trap device may thus be arranged in the form of a "cyclone" type trap device, and so may comprise a container, an inlet conduit configured to convey the waste stream tangentially into the container, an annular baffle located beneath the inlet conduit for separating the liquid compound from the waste stream, and an outlet conduit located above the baffle for conveying the waste stream from the container. The container is preferably located in the lowest point of the conduit system for conveying the waste stream from the chamber to an abatement device, so that the liquid compound drains into the container under gravity.

The present invention further provides a system for conveying a gas stream from a chamber to an abatement device, the system comprising a trap device as aforementioned. The system may comprise a vacuum pump located downstream from the trap device for drawing the waste stream from the chamber, the trap device serving to reduce the amount of liquid compound entering, and therefore accumulating within, the pump. Alternatively, the system may comprise a vacuum pump located upstream from the trap device for drawing the waste stream from the chamber, the trap device here serving to reduce the amount of liquid compound entering the abatement device.

Features described above relating to the apparatus aspects of the invention are equally applicable to the method aspect, and vice versa.

While the foregoing description and drawings represent the preferred embodiments of the present invention, it will be apparent to those skilled in the art that various changes and modifications may be made therein without departing from the true spirit and scope of the present invention.

We claim:

1. A trap device for removing a liquid compound from a waste stream exhaust from a process chamber comprising:
   a separation unit configured to separate the liquid compound from the waste stream while the liquid compound is in a liquid state, wherein the liquid compound is part of the waste stream before the waste stream enters the separation unit;
   a collection device configured to collect the liquid compound separated from the waste stream;
   a flow control device configured to selectively isolate the collected liquid compound from the waste stream;
   a heating device configured to evaporate the liquid compound collected within the collection device to return the compound in gaseous form to the waste stream;
   a conduit configured to convey the compound in gaseous form from the collection device to the waste stream downstream from the separation unit; and
   a controller configured to control the rate of evaporation of the liquid compound from the collection device.

2. The trap device of claim 1, further comprising a purge gas supply configured to convey a purge gas to the collection device to isolate the collected liquid compound from the waste stream.

3. The trap device of claim 2, wherein the purge gas supply is configured to convey purge gas into or proximate the collected liquid compound.

4. The trap device of claim 1, further comprising a conduit system configured to connect the collection device to the waste stream, wherein the flow control device is located within the conduit system, and wherein the conduit system comprises the conduit.

5. The trap device of claim 4, wherein the conduit comprises a first conduit, and wherein the conduit system further comprises a second conduit configured to convey the liquid compound from the separation unit to the collection device.

6. The trap device of claim 5, wherein the flow control device comprises a first valve located in the second conduit configured to selectively isolate the collection device from the separation unit, and a second valve located in the first conduit for selectively isolating the collection device from the waste stream downstream from the separation unit.

7. The trap device of claim 6, further comprising a valve controller configured to control opening and closing of the first and second valves.

8. The trap device of claim 7, wherein the valve controller is configured to open the first and second valves during the collection of the liquid within the collection device.

9. The trap device of claim 7, wherein the valve controller is configured to close both of the first and second valves to isolate the collection device from the waste stream.

10. The trap device of claim 6, further comprising a heater configured to heat the first conduit to inhibit condensation of the compound in gaseous form therein.

11. The trap device of claim 6, wherein the first conduit is arranged to receive the liquid compound from the separation unit at one end thereof and supply the liquid compound to the collection device at the other end thereof, the second conduit being located between the ends of the first conduit and extending outwardly therefrom.

12. The trap device of claim 1, wherein the controller comprises a detector configured to monitor the amount of liquid collected by the collection device.

13. The trap device of claim 1, wherein the controller comprises a sensor configured to monitor a temperature within the collection device.

14. The trap device of claim 12, wherein the controller is configured to control the heating device in dependence on a signal output from the detector.

15. The trap device of claim 1, wherein the separation unit comprises a filter configured to permit the liquid compound to pass therethrough to the collection device while the liquid compound is in the liquid state and inhibit the passage of solids therethrough.

16. The trap device of claim 15, wherein the filter comprises a first filter, and wherein the separation unit further comprises a second filter configured to capture particulates contained within the waste stream.

17. The trap device of claim 1, wherein the separation unit comprises an annular baffle disposed within the collection device.

18. The trap device of claim 17, wherein the annular baffle is frustro-conical and is arranged within the collection device such that the baffle widens towards an inlet of the collection device for receiving the waste stream.

19. The trap device of claim 17, wherein the collection device comprises a container housing the annular baffle, the trap device further comprising an inlet conduit for conveying the waste stream tangentially into the container above the baffle, and an outlet conduit located above the annular baffle for conveying the waste stream from the container.

20. The trap device of claim 1, wherein the liquid compound is a volatile organic compound.

21. A system for conveying a waste stream from a chamber to an abatement device, the system comprising a trap device for removing a liquid compound from the waste stream, the trap device comprising:
a separation unit configured to separate the liquid compound from the waste stream while the liquid compound is in a liquid state, wherein the liquid compound is part of the waste stream before the waste stream enters the separation unit;
a collection device configured to collect the liquid compound separated from the waste stream;
a flow control device configured to selectively isolate the collected liquid compound from the waste stream;
a heating device configured to evaporate the liquid compound collected within the collection device to return the compound in gaseous form to the waste stream;
a conduit configured to convey the compound in gaseous form from the collection device to the waste stream downstream from the separation unit; and
a controller configured to control the rate of evaporation of the liquid compound from the collection device.

22. The system of claim 21, further comprising at least one vacuum pump located downstream from the trap device for drawing the waste stream from the chamber.

23. The system of claim 21, further comprising at least one vacuum pump located upstream from the trap device for drawing the waste stream from the chamber.

24. The system of claim 21, wherein the conduit comprises a first conduit, wherein the trap device further comprises a conduit system configured to connect the collection device to the waste stream, wherein the conduit system comprises the first conduit and a second conduit configured to convey the liquid compound from the separation unit to the collection device, and wherein the flow control device is located within the conduit system.

* * * * *

UNITED STATES PATENT AND TRADEMARK OFFICE
CERTIFICATE OF CORRECTION

| | | |
|---|---|---|
| PATENT NO. | : 8,657,942 B2 | Page 1 of 1 |
| APPLICATION NO. | : 11/887124 | |
| DATED | : February 25, 2014 | |
| INVENTOR(S) | : Shaw et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1609 days.

Signed and Sealed this
Eleventh Day of August, 2015

Michelle K. Lee
*Director of the United States Patent and Trademark Office*